United States Patent [19]
Antich et al.

[11] Patent Number: 5,880,490
[45] Date of Patent: Mar. 9, 1999

[54] SEMICONDUCTOR RADIATION DETECTORS WITH INTRINSIC AVALANCHE MULTIPLICATION IN SELF-LIMITING MODE OF OPERATION

[75] Inventors: Peter P. Antich, Richardson; Edward N. Tsyganov, Duncanville, both of Tex.

[73] Assignee: Board of Regents, The University of Texas System, Austin, Tex.

[21] Appl. No.: 901,212

[22] Filed: Jul. 28, 1997

[51] Int. Cl.$^6$ .................................................. H01L 31/0328
[52] U.S. Cl. .......................... 257/186; 257/438; 257/443
[58] Field of Search .................................... 257/186, 438, 257/443, 461

[56] References Cited

U.S. PATENT DOCUMENTS

| | | | |
|---|---|---|---|
| 3,622,784 | 11/1971 | Del Guercio | 250/71.5 |
| 3,894,280 | 7/1975 | Bishop et al. | 321/18 |
| 3,935,382 | 1/1976 | Hunt | 178/7.1 |
| 4,007,104 | 2/1977 | Summers et al. | 204/192 |
| 4,194,888 | 3/1980 | Schwab et al. | 55/2 |
| 4,311,908 | 1/1982 | Goulianos et al. | 250/374 |
| 4,464,630 | 8/1984 | Eddins | 330/107 |
| 4,486,765 | 12/1984 | Capasso | 357/13 |
| 4,535,233 | 8/1985 | Abraham | 250/214 |
| 4,730,128 | 3/1988 | Seki | 307/310 |
| 4,794,257 | 12/1988 | Baba et al. | 250/370.01 |
| 4,885,620 | 12/1989 | Kemmer et al. | 357/24 |
| 4,896,200 | 1/1990 | Seki et al. | 357/30 |
| 4,956,716 | 9/1990 | Hewitt et al. | 358/213.27 |
| 4,973,913 | 11/1990 | Oda | 328/117 |
| 5,026,148 | 6/1991 | Wen et al. | 350/386 |
| 5,138,476 | 8/1992 | Shibutani | 359/191 |
| 5,144,122 | 9/1992 | Danley et al. | 250/201.2 |
| 5,162,658 | 11/1992 | Turner et al. | 250/554 |
| 5,164,809 | 11/1992 | Street et al. | 257/55 |
| 5,198,673 | 3/1993 | Rougeot et al. | 250/370.11 |
| 5,245,191 | 9/1993 | Barber et al. | 250/363.04 |
| 5,281,821 | 1/1994 | Antich et al. | 250/368 |
| 5,334,839 | 8/1994 | Anderson et al. | 250/368 |

FOREIGN PATENT DOCUMENTS 1702831  10/1989  U.S.S.R. .

OTHER PUBLICATIONS

Afanasiev et al., "MRS Silicon Avalanche Detectors with Negative Feedback for Time–of–Flight Systems," Proceedings of the 4th International Conference on Advanced Technology and Particle Physics, Como, Italy, Oct. 3–7, 1994, published in Nuclear Physics B (Proc. Suppl.) 44, pp. 402–405 (1995).

Antich et al., "Avalanche Photo Diode with Local Negative Feedback Sensitive to UV, Blue and Green Light," Nuclear Instruments & Methods in Physics Research, Section A 389, pp. 491–498(1997).

Bisello et al., "Metal–Resistive Layer–Silicon (MRS) Avalanche Detectors with Negative Feedback," Proceedings of Wire Chamber Conference, Feb. 1995, published in Nuclear Instruments and Methods in Physics Research A 360, pp.83–86 (1995).

Bisello et al., "Electrical Characteristics of Metal–Resistive Layer–Silicon (MRS) Avalanche Detectors, " Proceedings of the 4th International Conference on Advanced Technology and Particle Physics, Como, Italy, Oct. 3–7, 1994, published in Nuclear Physics B (Proc. Suppl.) 44, pp. 397–401 (1995).

(List continued on next page.)

*Primary Examiner*—Minh Loan Tran
*Attorney, Agent, or Firm*—Arnold, White & Durkee

[57] ABSTRACT

The disclosed invention includes an apparatus and method for detecting radiation in a detector. The radiation to be detected ionizes the atoms in the intrinsic silicon lattice of the detector to produce a small signal of freed elections. The small signal is then amplified by avalanche multiplication in a self-limiting manner by preventing the amplified electrons from traveling through a resistive layer, thereby reducing the electric field to limit the avalanche multiplication. An imaging system incorporating the new detector design is also disclosed.

47 Claims, 3 Drawing Sheets

OTHER PUBLICATIONS

Bisello et al., "Silicon Avalanche Detectors with Negative Feedback as Detectors for High Energy Physics," Proceedings of Wire Chamber Conference, Feb. 1995, published in Nuclear Instruments and Methods in Physics Research A 367, pp. 212–214 (1995).

Kulkarni et al., "New Approaches in Medical Imaging Using Plastic Scintillating Detector," Nuclear Instruments and Methods in Physics Research B79, pp. 921–925 (1993).

Locker et al., "A New Ionizing Radiation Detection Concept Which Employs Semiconductor Avalanche Amplification and the Tunnel Diode Element," Applied Physics Letters, vol. 9, No. 6, pp. 227–230 (1996).

Sadygov et al., "The Investigation of Possibility to Create the Multichannel Photodetector Based on the Avalanche MRS—Structure," Proceedings of the SPIE–The International Society for Optical Engineering, Zvenigorod, USSR, Apr. 2–6, 1991, published in SPIE vol. 1621, Optical Memory and Neural Networks, pp. 158–168(1991).

Shushakov et al., "New Solid State Photomultiplier," Report at Optoelectronic Integrated Circuit Materials, Physics and Devices Conference (part of Photonics West 95 Symposium, Feb. 11, 1995, SPIE vol. 2397, pp. 544–554 (1995).

U.S. Patent Application Ser. No. 08/771,207, entitled "Wide Wavelength Range High Efficiency Avalache Light Detector with Negative Feedback," by Peter P. Antich and Edward N. Tsyganov, filed Dec. 20,1996.

SEMICONDUCTOR RADIATION DETECTORS WITH INTRINSIC AVALANCHE MULTIPLICATION IN SELF-LIMITING MODE OF OPERATION

BACKGROUND OF THE INVENTION

This invention relates generally to an improved radiation detector and more specifically to a radiation detector with self-limiting amplification properties.

Semiconductor solid-state radiation detectors have long been used in nuclear medicine, science and industry. Such devices are useful in detecting radiation such as X-rays, gamma rays, electron beams, or neutron beams.

Solid state detectors generally operate utilizing a process known as ionization. During ionization, radiation that impinges into the detector will cause valance electrons and holes (more generally referred to as charge carriers) to be freed in the detector. The number of freed charge carriers will depend on the energy of the impinging radiation, and therefore this energy can be measured. The freed charge carriers create a small electrical signal indicative of when and where an ionization event has occurred within the detector, and the energy thereof.

Prior art solid state detectors generally consist of two types, both of which suffer from inherent operational problems. In widely-accepted detectors of the first type, the small electrical signals produced by the freed charge carriers are sensed without being amplified within the detector. Because these small signals are generally very weak, they must be subsequently amplified in order to produce an electrical signal suitable for subsequent processing. However, subsequent amplification introduces additional noise, therefore hampering the detection of relatively low-energy ionization events.

In detectors of the second type, the small signals produced by the freed charge carriers are amplified within the detector itself through a process called avalanche multiplication. In avalanche multiplication, an electron (or hole) freed from a first atom is accelerated within the detector material (e.g., a crystalline silicon lattice) by an electric field produced by an external electrical bias applied to the detector material. If the electron gains enough energy by this acceleration, it can then impinge upon a second atom and free an electron from it, thus producing two freed electrons (and holes). This process continues in an exponential fashion until many freed charge carriers are produced. Thus, through avalanche multiplication, the initial small signal produced by the initial ionization event is intrinsically amplified within the detector and produces a stronger signal better suited for use in subsequent signal processing. While one of ordinary skill will understand the basic principles of avalanche multiplication as it applies to radiation detectors, the reader is referred to S. M. Sze, "Physics of Semiconductor Devices," John Wiley & Sons, pp. 99–108 (1981), which is incorporated herein in its entirety, for further clarification. Because avalanche multiplication is a fast, low noise method for amplifying a small signal produced by an ionization event, detectors using avalanche multiplication may be superior for certain applications.

However, intrinsic amplification by avalanche multiplication is not without its drawbacks. The exponential generation of charge carriers by avalanche multiplication makes it very difficult to control. This presents a serious drawback in that: 1) due to the stochasticity of the process, it is difficult to know to what extent an initial small signal will be subsequently amplified using avalanche multiplication, and 2) the detector may be damaged if the avalanche multiplication cannot be controlled. Moreover, traditional p-i-n detectors (i.e., wherein an intrinsic, undoped semiconductor is situated between a p-doped semiconductor and an n-doped semiconductor) using avalanche multiplication require undesireably high biasing voltages (e.g., hundreds of Volts). Moreover, such devices are difficult to fabricate in a manner that will provide a suitably high spatial resolution of detected radiation.

The disclosed detector improves upon the prior art in a manner which alleviates the foregoing problems by presenting a novel detector design which uses a self-limiting avalanche multiplication mode of operation.

SUMMARY OF THE INVENTION

According to one aspect of the invention, a radiation detector responsive to impinging radiation is disclosed. The radiation detector comprises: an intrinsic semiconductor layer coupled to a reference potential and capable of ionization from the impinging radiation to form freed charge carriers; a first doped region built within the intrinsic semiconductor layer and doped to a first conductivity type; a second doped region built within the first doped region and doped to a second conductivity type which is of opposite polarity to the first conductivity type, the interface between the second doped region and the first doped region defining a junction; a resistive layer formed on top of the second doped region; and a conductive layer formed on top of the resistive layer and coupled to a bias potential.

According to another aspect of the invention, a radiation detector array responsive to impinging radiation is disclosed. The array including a plurality of voxels, the array comprises: an intrinsic semiconductor layer capable of ionization from the impinging radiation to form freed electrons and holes; a plurality of first doped region strips built within the intrinsic semiconductor layer and doped to a first conductivity type, the first doped region strips running substantially in a first direction; a plurality of second doped regions built within the plurality of first doped region strips and doped to a second conductivity type which is of opposite conductivity to the first conductivity type, the interface between the plurality of second doped regions and the plurality of first doped region strips defining a plurality of junctions; a resistive layer formed on top of the plurality of second doped regions; a plurality of conductive layer strips formed on top of the resistive layer, the plurality of conductive layers strips running over and parallel to the plurality of first doped region strips, the plurality of conductive layer strips coupled to a bias potential, the plurality of conductive layer strips and the plurality of first doped region strips defining a plurality of columns; and a plurality of rows orthogonal to the plurality of columns and separated from the plurality of columns by the intrinsic semiconductor layer, the plurality of rows coupled to a reference potential, the intersection of the plurality of columns and the plurality of rows defining the plurality of voxels, each voxel including at least one junction.

According to another aspect of the invention, a voxel in a detector array responsive to impinging radiation is disclosed. The voxel comprises: an intrinsic semiconductor layer capable of ionization from the impinging radiation to form freed charge carriers; a first doped region built within the intrinsic semiconductor layer and doped to a first conductivity type; a plurality of substantially semi-spherical second doped regions built within the first doped region and doped to a second conductivity type which is of opposite polarity to the first conductivity type, the interface between the plurality of second doped regions and the first doped region defining a plurality of junctions; a resistive layer formed on top of the plurality of second doped regions; and a conductive layer formed on top of the resistive layer.

According to another aspect of the invention, a radiation detector responsive to impinging radiation is disclosed. The radiation detector comprises: an intrinsic semiconductor layer capable of ionization from the impinging radiation to form freed charge carriers; means for amplifying the freed charge carriers by avalanche multiplication; and means for self-limiting the avalanche multiplication.

According to another aspect of the invention, a method for detecting radiation in a detector is disclosed. The detector includes an intrinsic semiconductor layer, at least one reverse-biased p-n junction built into the intrinsic semiconductor layer, a resistive layer formed on top of the at least one p-n junction, and a first conductive layer formed on top of the resistive layer. The disclosed method comprises the steps of: ionizing the intrinsic silicon layer via radiation to produce a small signal of freed charge carriers; amplifying the freed charge carriers by avalanche multiplication in the junction, the avalanche multiplication being self-limiting by preventing the flow of the amplified freed charge carriers through the resistive layer; and detecting the amplified freed charge carriers by coupling the amplified freed charge carriers to the first conductive layer through the resistive layer.

According to another aspect of the invention, a method for detecting radiation in a detector is disclosed. The detector includes an intrinsic semiconductor layer, at least one reverse-biased p-n junction built into the intrinsic semiconductor layer, a resistive layer formed on top of the at least one p-n junction, a first conductive layer formed on top of the resistive layer, and a second conductive layer positioned below the first conductive layer and separated therefrom by at least a portion of the intrinsic semiconductor layer. The method comprises the steps of: ionizing the intrinsic silicon layer via radiation to produce a small signal of freed electrons and freed holes; amplifying the freed electrons by avalanche multiplication in the junction to produce amplified electrons and amplified holes, the avalanche multiplication being self-limiting by preventing the flow of the amplified electrons through the resistive layer; detecting the amplified electrons by coupling the amplified electrons to the first conductive layer through the resistive layer; and detecting the amplified holes at the second conductive layer.

According to another aspect of the invention, an imaging system is disclosed. The imaging system comprises the inventive radiation detector and a processing system for manipulating the electrical signals produced by the detector, the processing system manipulating the electrical signals to provide an image of the detected radiation.

DESCRIPTION OF ILLUSTRATIVE EMBODIMENTS

Illustrative embodiments of the invention are described below as they might be employed in a semiconductor radiation detector which intrinsically amplifies a small signal produced by an ionization event through the use of avalanche multiplication in a self-limited avalanche mode. In the interest of conciseness, not all features of an actual implementation are described in this specification. It will of course be appreciated that in the development of any such actual embodiment, numerous implementation-specific decisions must be made to achieve the developer's specific goals, such as compliance with system-related and business-related constraints. Moreover, it will be appreciated that even if such a development effort might be complex and time-consuming, it would nevertheless be a routine undertaking for those of ordinary skill having the benefit of this disclosure.

I. An Illustrative Embodiment of the Inventive Radiation Detector

Figure 1A:
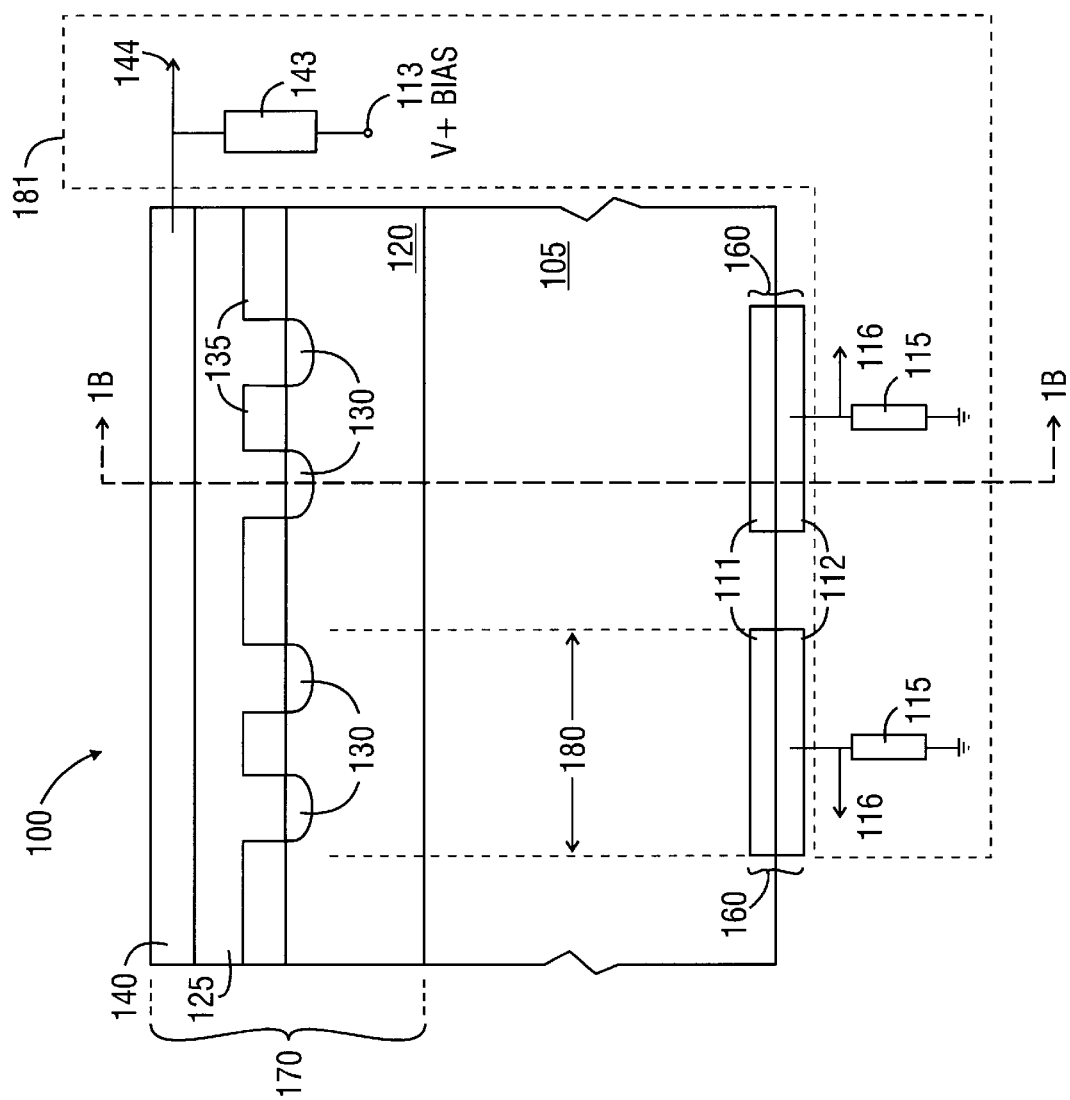
FIG. 1A shows a cross-section of the disclosed inventive radiation detector array.
Figure 1B:
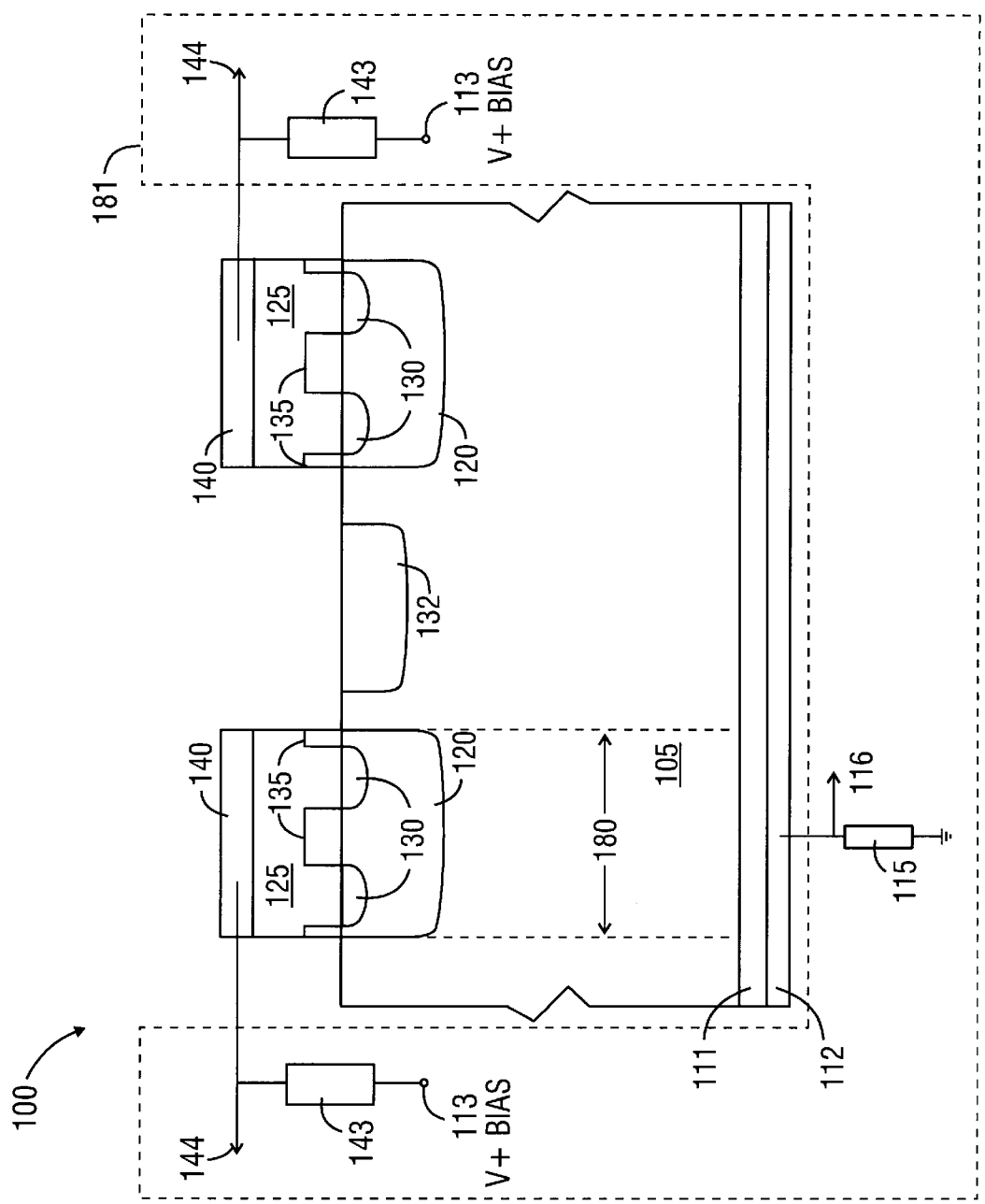
FIG. 1B shows a cross-section of the disclosed inventive radiation detector array which is orthogonal to the cross-section shown in FIG. 1A.

FIGS. 1A and 1B show orthogonal cross-sectional views of a portion of the inventive radiation detector 100, complete with electrical circuitry 181 capable of operating the detector. One of ordinary skill will realize that the radiation detector is actually a planar array formed from a planar substrate of intrinsic silicon 105 or other suitable semiconductor material. In an actual commercial embodiment the detector array would likely be part of a detector "chip" or integrated circuit which might also contain detector sensory circuits and other support circuitry.

A. Construction and Fabrication:

The detector 100 is comprised of a bulk layer of intrinsic silicon 105; p regions 120; n+ regions 130; an oxide layer 135; a resistive layer 125; a metal layer 140; a p+ layer 111; and metal contacts 112. Also shown is electrical circuitry 181 which comprises resistors 115; a DC power supply 113; and resistors 143. As one of ordinary skill will recognize, "p" and "n" refer to silicon which has been doped with dopants of different conductivity types, i.e., with dopants suitable for creating either excess holes or electrons respectively. The "+" symbol means that the silicon has been highly doped with the suitable dopant.

Generally, the detector array is comprised of rows and columns. The rows 160 are defined by the several p+ layers 111 and their corresponding metal contacts 112 which run in parallel strips along the bottom surface of the intrinsic silicon 105. The columns 170 are defined by the several p regions 120 and their corresponding metal layers 140 which run in parallel strips along the top surface of the intrinsic silicon 105. As clarified by the orthogonal cross-sections in FIGS. 1A and 1B, the rows 160 and columns 170 are perpendicular with respect to one another, and only two rows and columns are shown. Where a given row 160 and column 170 intersect defines a voxel 180 in the detector array. An ionization event occurring within a given voxel 180 in the intrinsic silicon layer 105 will cause an electrical signal to form on the row 160 and column 170 intersecting at that voxel, as will be described in more detail herein.

Many of the details of the fabrication of detector 100 will be known to one of ordinary skill in the art of semiconductor or detector fabrication, and will only be briefly described here in enough detail to understand the scope of the invention. The manufacturing methods described herein could be changed in many respects not crucial to the inventive aspects of this disclosure.

Manufacturing starts with an intrinsic crystalline silicon wafer 105 which is substantially free of excess charge carriers. The intrinsic silicon wafer 105 should be of high-purity and essentially free of crystalline dislocations. The bottom of the wafer 105 is processed to form rows 160 using conventional semiconductor processing techniques. First, p+ layers 111 are formed, for example by masking and ion-implanting these regions with a suitable p-type dopant such as boron or gallium. Next, metal layer 112 is deposited, patterned, and etched to form strips in electrical contact with p+ layers 111.

On the top side of the wafer 105, the p regions 120 are formed into strips by masking followed by ion implantation. The p regions 120 are preferably formed about 1–5 microns deep below the surface of intrinsic silicon wafer 105 and are doped to a level of about 1.5E16 dopant atoms per cubic centimeter. The concentration of p region 120 could be varied depending on the desired operational parameters of the detector, as will be described in more detail herein.

Next, n+ regions 130 are formed within the p regions 120. First, a silicon dioxide layer 135 is thermally grown or deposited on the top surface of the intrinsic silicon wafer 105. The silicon dioxide layer 135 is then masked and etched to form holes therein, and n-type dopants (e.g., phosphorous or arsenic) are implanted therethrough to form regions 130. The n+ regions 130 should be doped to a level of about 1E18 dopant atoms per cubic centimeter and are preferably curved or roughly semi-spherical in shape, for reasons to be clarified later. As shown in FIGS. 1A and 1B, each voxel 180 contains four n+ regions 130 (i.e., two-by-two), but this is merely illustrative. In reality, each voxel 180 can consist of many such n+ regions 130 depending on desired operational characteristics.

Next, as seen in FIG. 1B, p+ regions 132 are formed, again by ion implantation. The p+ regions 132 are formed in strips surrounding the p regions 120 that form the columns 170. The p+ regions 132 act as "channel stops" to prevent column-to-column leakage in the detector 100. Such leakage may result from positive charges trapped in the silicon dioxide 135 which overlays much of the structure. These charges will tend to accumulate electrons at the surface of oxide 135, thereby possibly shorting the n+ regions 130 which exist on adjacent columns, resulting in a undesirable column-to-column short. One of ordinary skill will realize that the presence of p+ regions 132, while beneficial, are not strictly required for proper device operation, and that other suitable means for isolating adjacent columns may be utilized.

Next, a resistive layer 125 is deposited onto the top surface of the wafer. The resistive layer 125 is preferably a high band-gap material such as silicon carbide, but may also be silicon dioxide interspersed with amorphous silicon (i.e., $Si_xO_y$). This layer is preferably 0.35 microns thick, but may be made thicker or thinner, or more or less resistive, depending on the application. Thereafter, metal layer 140 is deposited onto the resistive layer 125. The metal layer 140 is preferably aluminum, but may also be titanium or another suitable conductive material. The metal layer 140, the resistive layer 125, and the silicon dioxide layer 135 are then patterned and etched to form strips which correspond with the p regions 120. While the resistive layer 125 and the silicon dioxide layer 135 do not necessarily need to be etched, it is believed that removing them will be beneficial in reducing column-to-column leakage. In an actual commercial embodiment the resulting structure would then be covered with a protective, passivating layer, such as silicon dioxide (not shown).

In a completed detector array, the metal layers 112 corresponding to the rows 160 and metal layers 140 corresponding to the columns 170 would be connected, outside of the detector array, to circuitry 181 capable of detecting when an ionization event has occurred at a given voxel 180. The details and layout of such circuitry would be a routine exercise for one of ordinary skill. A DC power supply 113, which is coupled through resistors 143 to each of the metal layer strips 140, provides a voltage bias for the detector. The reference terminal of the DC power supply 113 is coupled to the metal row strips 112 through resistors 115.

B. Operation:

1. Avalanche Multiplication:

The detector constructed as above is preferably operated as follows. The DC power supply 113 is biased to approximately 40V. This voltage is directed through resistor 143 to metal 140 and then is coupled through resistive layer 125 to n+ regions 130. The voltage at n+ regions 130 acts to fully deplete p regions 120 of excess charge carriers and to fully deplete the intrinsic silicon 105. The depletion of p region 120 results in a very high electric field (e.g., greater than 3E5 V/cm) in these regions of the detector. An electric field is also produced in the intrinsic silicon 105, but this field will be much smaller than the field produced in the region 120.

When an ionization event occurs in the intrinsic silicon 105 as a result of impinging radiation, electron-hole pairs are generated as described above. Because of the electric field in the intrinsic silicon 105, the electron-hole pairs will separate, with the electrons traveling to the nearest n+ region 130 and the corresponding holes traveling to the nearest p+ layer 111. When the electrons reach the interface of the intrinsic silicon 105 and the p region 120, they will encounter the high electric field in region 120 and begin to accelerate. The acceleration in this region near the p-n junction will be sufficient to cause avalanche multiplication of the electrons, thus amplifying the small signal provided by the electrons initially produced by ionization. Likewise, the extra holes produced by avalanche multiplication will proceed in the opposite direction towards the nearest p+ layer 111. The amplification or multiplication factor of the small signal (i.e., the numbers of electrons produced by avalanche multiplication divided by the number of electrons produced by the initial ionization event) will depend in large part on the doping concentration of p region 120. Higher doping will necessitate a higher DC power supply voltage level 113 to fully deplete this region, which will in turn increase the electric field and the multiplication factor. A detector array constructed as described herein is expected to produce a multiplication factor in the range of 1E5. Because the p region 120 has been depleted of excess charge carriers, the electrons produced by avalanche multiplication will be unable to recombine in this layer.

To further increase the effects of avalanche multiplication and the multiplication factor, the electric field inside the p region 120 can be accentuated by causing the n+ regions 130 to have a curved surface. The biasing arrangement as disclosed will cause the p-n junction formed by the n+ region 130 and p region 120 to be reverse-biased. The reverse biasing of the junction alone could create an electric field suitable for facilitating avalanche multiplication. However, by causing this junction to be curved, the electric field will be increased even further (because the electric field in the vicinity of the semi-spherical shaped junction is roughly proportional to the square of the inverse of junction radius). To collect the small signals produced by all ionization events within the detector, many n+ regions 130 will appear within a given voxel 180 as described earlier. Thus, the junction formed at the interface of p region 120 and n+ region 130 produces avalanche multiplication.

2. The Avalanche Multiplication of the Disclosed Detector Structure is Self Limiting:

After ionization and avalanche multiplication, the multiplied electrons will eventually wind up at the n+ regions 130 at a given voxel 180. The resistive layer 125 delays the discharge or passage of the electrons present in the n+ regions 130 to the metal layer 140. When a sufficient number of electrons are present at the n+ regions 130, these electrons will reduce the electric field intensity in the p region 120 provided by DC power supply 113. When this reducing effect becomes strong enough, it will lower the peak electric field in the avalanche region and prevent subsequent electrons from being amplified by avalanche multiplication. Thus, the inventive detector design as disclosed is self-limiting, thus greatly improving on prior art avalanche multiplication detectors. Moreover, the self-limiting nature reduces the effects of structural and dopant non-uniformities in the crystalline silicon and bias voltage instabilities that hampered prior art detectors using avalanche multiplication.

3. Sensing an Ionization Event:

As previously noted, the disclosed detector 100 is arranged as an array of voxels 180, each voxel being defined as the intersection of the rows 160 (i.e., p+ layers 111 and metal layers 112) and the columns 170 (i.e., p regions 120, n+ regions 130, and metal layers 140). Moreover, each voxel 180 may be comprised of many n+ regions 130 which are arrayed inside the p regions 120 that form the columns 170. Because the detector array includes various voxels 180, the location of an ionizing event within the detector can be determined.

This occurs as follows. When an ionizing event occurs within the intrinsic silicon layer 105, the freed electron(s), guided by the electric field generated by DC power supply 113 and ultimately amplified by the self-limiting avalanche multiplication process, will travel towards the nearest column 170, and the corresponding holes will travel towards the nearest row 160. When the electrons appear at the n+ regions 130 on a given column, they will cause the metal layer 140 associated with the column 170 to drop in voltage. This occurs because the resistive layer will capacitively couple the presence of the electrons onto the metal line 140. Accordingly, the voltage tap 144 connected to a sensing element such as resistor 143 can be monitored for a drop in voltage, the drop signifying that an ionization event has occurred at some location on the column. Likewise, the holes will cause an increase at the voltage tap 116 of a sensing element such as resistor 115, this increase signifying that an ionization event has occurred at some location on the row. When the rows and columns are concurrently monitored by the detector sensing circuits (not shown) connected to the resistor voltage taps, the detector 100 can then determine the location of the ionization event in the two-dimensional detector array. Suitable detector sensing circuits can be built on the same detector circuit chip that contains the inventive detector array.

Moreover, the energy of the impinging radiation can be determined because the signal formed at the resistor voltage taps 144 and 116 will generally be proportional to the energy of the radiation. This is true because the energy of the impinging radiation will usually not be sufficient to cause the detector to self-limit through the mechanisms described earlier. However, because of the stochasticity of the avalanche multiplication process, sometimes even relatively low energy radiation will create a relatively large amplified signal, thus creating a sufficient opposing electric field to self-limit the avalanche multiplication process. Of course, high energy radiation will be even more likely to cause self-limitation. When self-limitation occurs, the signal formed at the voltage taps 144 and 116 will saturate and will no longer be proportional to the energy of the impinging radiation.

As an alternative embodiment, a second layer of a suitable dielectric and second metal layer could be placed in strips on top of the metal layer strips 140 shown in FIGS. 1A and 1B. In this embodiment, the first layer of metal 140 could be connected to the DC power supply 113 through resistor 143, while the second layer of metal is connected to the detector sense circuits.

Because the small signal produced by the ionization event is amplified in a self-limiting manner, the electrical signals appearing on the resistors 143 and 115 are less sensitive to noise and are less easily corrupted by the noise of the detector sensing circuits appearing at the resistor voltage taps 144 and 116. Moreover, because the signals are sufficiently large in magnitude, the design of detector sensing circuits connected to the resistor voltage taps 144 and 116 can be greatly simplified to produce quick and reliable sensing of the ionization events.

One of ordinary skill will realize that the spatial resolution of the detector is limited primarily by the ability to process small voxels 180. The spatial resolution of the detector will therefore correspond to the feature size of the rows and columns of the detector. For example, if the rows and columns are spaced 25 microns apart, the detector will have a spatial resolution of approximately 25 microns in both dimensions.

One of ordinary skill will also realize that the disclosed detector array could be modified to operate without rows and columns, i.e., as a single voxel detector. A single voxel detector would not be able to "pinpoint" the location of the ionization event within the detector, but instead would determine simply when an ionization event has occurred (i.e., anywhere in the detector), and the energy thereof. In effect, such a detector would itself comprise a single appropriately-sized voxel as disclosed herein.

II. An Imaging System Using the Disclosed Radiation Detector

Figure 2:
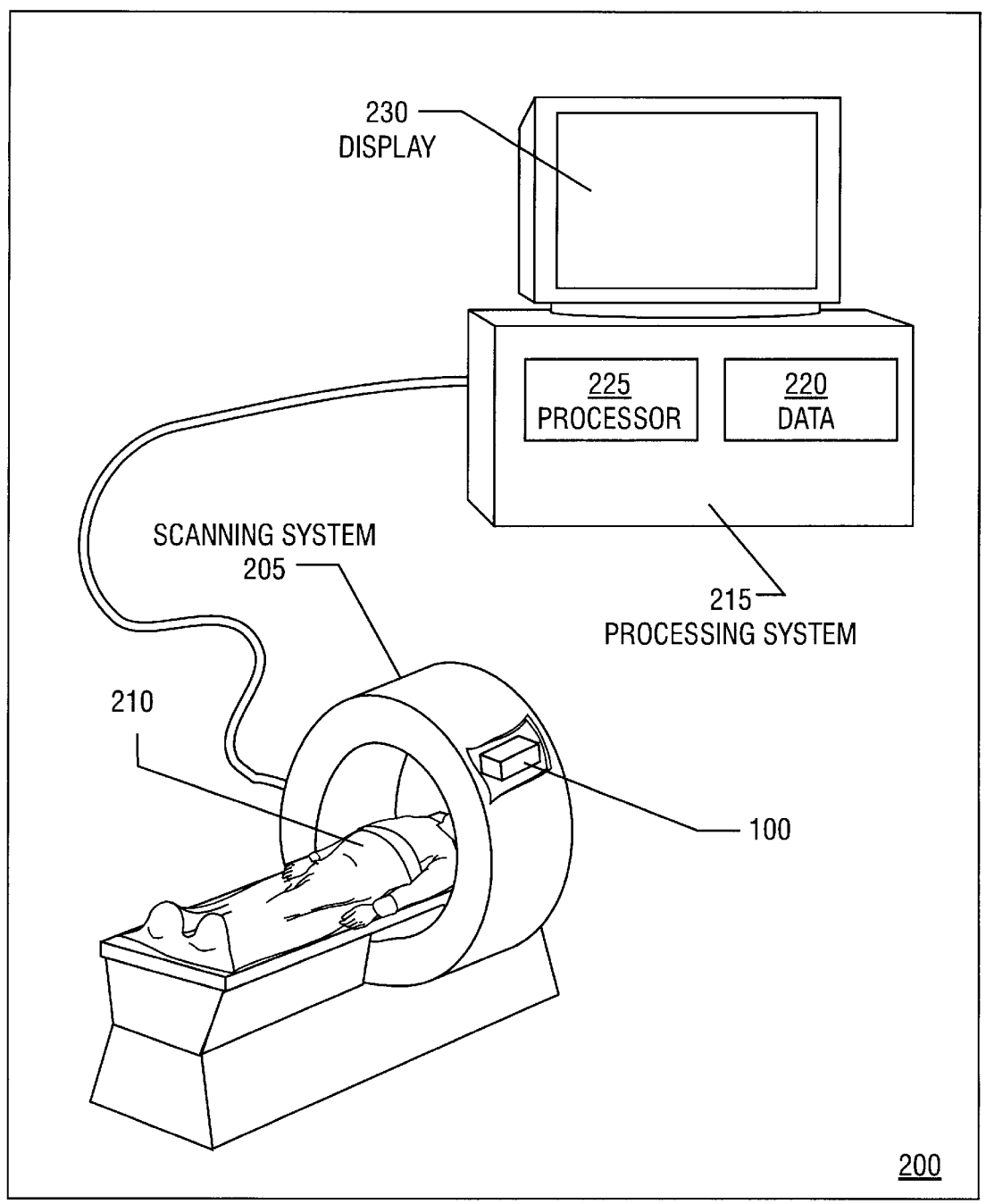
FIG. 2 shows an imaging system which incorporates the disclosed inventive radiation detector array.

FIG. 2 illustrates an imaging system 200 incorporating the inventive radiation detector 100. The imaging system 200 includes a scanning system 205, a processing system 215, and a display 230. Only one detector 100 is shown in scanning system 205, but in a useful commercial embodiment more would be present and might be placed all the way or partially around the scanning system ring to determine the presence of ionizing radiation from different angles.

One of ordinary skill will understand the basic operation of imaging system 200, and it is only briefly described here. One or more detectors 100 are connected to and in communication with the processing system 215, which is preferably a personal computer or a networked workstation. The processing system 215 receives the detected radiation from the scanning system 205 as data 220. Data 220 can be stored in the processing system, for example, in random-access-memory (RAM) or a hard disc drive. The processing system 215, with the assistance of processor 225, converts data 200 to form an image which can be shown on display 215.

Imaging system 200 can be used to diagnose, for example, the health of tissue in the human body 210. A radiation source, such as an X-ray source, can be located within the scanning system ring and rotated around human 210 such that radiation passes and impinges upon the human 210, interacts with the tissue to be observed, and exits the human where it is detected by one or more detectors 100 on the opposite side of the ring. Alternatively, the human 210 can be injected with or ingest a radio-pharmaceutical chemical (a "chemical tracer") capable of emitting radiation. The chemical tracer is absorbed predominantly in tumors or inflammation regions. The radiation produced by the chemical tracer exits the human 210 where it is detected by one or more detectors 100 appearing around the ring. One of ordinary skill will realize that many system configurations are possible which utilize the inventor detector, and that the above system configuration is only illustrative. For example, a flat panel of detectors, similar to a traditional chest X-ray machine, could also be used.

Imaging systems 200 incorporating the disclosed detector design are expected to be very useful in medical imaging (e.g., digital X-ray imaging). For example, in mammography, where very low-energy X-rays are used in the detection of breast tumors, the use of the disclosed detector is expected to produce very favorable results. Moreover, the disclosed detector should be particularly useful for PET (Positron Emission Tomography) scans, and SPECT (Single Positron Emission Computerized Tomography) scans.

III. Conclusion

A solid-state detector as disclosed herein can be used to produce robust, simple, and relatively inexpensive instruments. Because the disclosed detector relies on a self-limiting avalanche mechanism, amplification of an ionization event can be realized without the drawbacks of prior art detectors which do not use avalanche multiplication or those which do so in an unlimited fashion.

It will be appreciated by those of ordinary skill in the art having the benefit of this disclosure that numerous variations from the foregoing illustration will be possible without departing from the inventive concept described therein. Accordingly, it is the claims set forth below, and not merely the foregoing illustrations, which are intended to define the exclusive rights claimed in this patent.

What is claimed is:

1. A radiation detector responsive to impinging radiation, comprising:
   (a) an intrinsic semiconductor layer coupled to a reference potential and capable of ionization from the impinging radiation to form freed charge carriers;
   (b) a first doped region built within the intrinsic semiconductor layer and doped to a first conductivity type;
   (c) a second doped region built within the first doped region and doped to a second conductivity type which is of opposite polarity to the first conductivity type, the interface between the second doped region and the first doped region defining a junction;
   (d) a resistive layer formed on top of the second doped region; and
   (e) a conductive layer formed on top of the resistive layer and coupled to a bias potential.

2. The radiation detector of claim 1, wherein the bias potential and the reference potential create an electric field within the first doped region which amplifies the freed charge carriers by avalanche multiplication, and wherein the avalanche multiplication is self-limited by reducing the electric field.

3. The radiation detector of claim 2, wherein the electric field is reduced by delaying the passage of the amplified freed charge carriers through the resistive layer.

4. The radiation detector of claim 1, wherein the first conductivity type is p-type and the second conductivity type is n-type.

5. The radiation detector of claim 1, wherein the conductive layer is coupled to the bias potential through a sensing element.

6. The radiation detector of claim 1, wherein the intrinsic semiconductor layer is crystalline silicon.

7. The radiation detector of claim 1, wherein the resistive layer is silicon carbide.

8. The radiation detector of claim 1, wherein the resistive layer is $Si_xO_y$.

9. The radiation detector of claim 1, wherein the intrinsic semiconductor layer is coupled to the reference potential through a sensing element.

10. A radiation detector array responsive to impinging radiation, the array including a plurality of voxels, the array comprising:
    (a) an intrinsic semiconductor layer capable of ionization from the impinging radiation to form freed electrons and holes;
    (b) a plurality of first doped region strips built within the intrinsic semiconductor layer and doped to a first conductivity type, the first doped region strips running substantially in a first direction;
    (c) a plurality of second doped regions built within the plurality of first doped region strips and doped to a second conductivity type which is of opposite conductivity to the first conductivity type, the interface between the plurality of second doped regions and the plurality of first doped region strips defining a plurality of junctions;
    (d) a resistive layer formed on top of the plurality of second doped regions;
    (e) a plurality of conductive layer strips formed on top of the resistive layer, the plurality of conductive layers strips running over and parallel to the plurality of first doped region strips, the plurality of conductive layer strips coupled to a bias potential, the plurality of conductive layer strips and the plurality of first doped region strips defining a plurality of columns; and
    (f) a plurality of rows orthogonal to the plurality of columns and separated from the plurality of columns by the intrinsic semiconductor layer, the plurality of rows coupled to a reference potential, the intersection of the plurality of columns and the plurality of rows defining the plurality of voxels, each voxel including at least one junction.

11. The detector array of claim 10, wherein the bias potential and the reference potential create an electric field within at least one of the plurality of first doped regions which amplifies the freed electrons by avalanche multiplication, the amplified freed electrons producing amplified freed holes, and wherein the avalanche multiplication is self-limited by delaying the passage of the amplified freed electrons through the resistive layer.

12. The detector array of claim 11, wherein the at least one junction appears within a first voxel, the first voxel appearing at the intersection of a first row and a first column, and wherein the first column collects the amplified freed electrons and the first row collects the amplified freed holes to produce electrical signals on the first column and the first row to signify that an ionization event has occurred within the first voxel.

13. The detector array of claim 10, wherein the plurality of second doped region are substantially semi-spherical in shape.

14. The detector array of claim 10, wherein the first conductivity type is p-type and the second conductivity type is n-type.

15. The detector array of claim 10, wherein the intrinsic semiconductor layer is crystalline silicon.

16. The detector array of claim 10, wherein the resistive layer is silicon carbide.

17. The radiation detector of claim 10, wherein the resistive layer is $Si_xO_y$.

18. A voxel in a detector array responsive to impinging radiation, comprising:
   (a) an intrinsic semiconductor layer capable of ionization from the impinging radiation to form freed charge carriers;
   (b) a first doped region built within the intrinsic semiconductor layer and doped to a first conductivity type;
   (c) a plurality of substantially semi-spherical second doped regions built within the first doped region and doped to a second conductivity type which is of opposite polarity to the first conductivity type, the interface between the plurality of second doped regions and the first doped region defining a plurality of junctions;
   (d) a resistive layer formed on top of the plurality of second doped regions; and
   (e) a conductive layer formed on top of the resistive layer.

19. The voxel of claim 18, wherein the intrinsic semiconductor layer is coupled to a reference potential and the conductive layer is coupled to a bias potential, and wherein the bias potential and the reference potential create an electric field within the first doped region which amplifies the freed charge carriers by avalanche multiplication.

20. The voxel of claim 19, wherein the avalanche multiplication is self-limited by reducing the electric field.

21. The voxel of claim 20, wherein the electric field is reduced by delaying the passage of the amplified freed charge carriers through the resistive layer.

22. The voxel of claim 18, wherein the first conductivity type is p-type and the second conductivity type is n-type.

23. The voxel of claim 18, wherein the intrinsic semiconductor layer is crystalline silicon.

24. The voxel of claim 18, wherein the resistive layer is silicon carbide.

25. The voxel of claim 18, wherein the resistive layer is $Si_xO_y$.

26. A radiation detector responsive to impinging radiation, comprising:
   (a) an intrinsic semiconductor layer capable of ionization from the impinging radiation to form freed charge carriers;
   (b) means for amplifying the freed charge carriers by avalanche multiplication; and
   (c) means for self-limiting the avalanche multiplication.

27. The radiation detector of claim 26, wherein the means for amplifying includes at least one substantially semi-spherical reverse-biased p-n junction built into the intrinsic semiconductor layer.

28. A method for detecting radiation in a detector, the detector including an intrinsic semiconductor layer, at least one reverse-biased p-n junction built into the intrinsic semiconductor layer, a resistive layer formed on top of the at least one p-n junction, and a first conductive layer formed on top of the resistive layer, the method comprising the steps of:
   (a) ionizing the intrinsic silicon layer via radiation to produce a small signal of freed charge carriers;
   (b) amplifying the freed charge carriers by avalanche multiplication in the junction, the avalanche multiplication being self-limiting by preventing the flow of the amplified freed charge carriers through the resistive layer; and
   (c) detecting the amplified freed charge carriers by coupling the amplified freed charge carriers to the first conductive layer through the resistive layer.

29. The method of claim 28, wherein the at least one junction is substantially semi-spherical in shape.

30. The method of claim 28, wherein the intrinsic semiconductor layer is crystalline silicon.

31. The method of claim 28, wherein the resistive layer is silicon carbide.

32. The method of claim 28, wherein the resistive layer is $Si_xO_y$.

33. A method for detecting radiation in a detector, the detector including an intrinsic semiconductor layer, at least one reverse-biased p-n junction built into the intrinsic semiconductor layer, a resistive layer formed on top of the at least one p-n junction, a first conductive layer formed on top of the resistive layer, and a second conductive layer positioned below the first conductive layer and separated therefrom by at least a portion of the intrinsic semiconductor layer, the method comprising the steps of:
   (a) ionizing the intrinsic silicon layer via radiation to produce a small signal of freed electrons and freed holes;
   (b) amplifying the freed electrons by avalanche multiplication in the junction to produce amplified electrons and amplified holes, the avalanche multiplication being self-limiting by preventing the flow of the amplified electrons through the resistive layer;
   (c) detecting the amplified electrons by coupling the amplified electrons to the first conductive layer through the resistive layer; and
   (d) detecting the amplified holes at the second conductive layer.

34. The method of claim 33, wherein the at least one junction is substantially semi-spherical in shape.

35. The method of claim 33, wherein the intrinsic semiconductor layer is crystalline silicon.

36. The method of claim 33, wherein the resistive layer is silicon carbide.

37. The method of claim 33, wherein the resistive layer is $Si_xO_y$.

38. An imaging system comprising:
   (a) a radiation detector capable of producing electrical signals, the signals being indicative of a detected ionization event within the detector, the detector including:
      (i) an intrinsic semiconductor layer coupled to a reference potential and capable of ionization from the impinging radiation to form freed charge carriers;
      (ii) a first doped region built within the intrinsic semiconductor layer and doped to a first conductivity type;
      (iii) a second doped region built within the first doped region and doped to a second conductivity type which is of opposite polarity to the first conductivity type, the interface between the second doped region and the first doped region defining a junction;
      (iv) a resistive layer formed on top of the second doped region; and
      (v) a conductive layer formed on top of the resistive layer and coupled to a bias potential; and
   (b) a processing system for manipulating the electrical signals produced by the detector, the processing system manipulating the electrical signals to provide an image of the detected radiation.

39. The imaging system of claim 38, further comprising a display for displaying the image of the detected radiation.

40. The imaging system of claim 38, wherein the bias potential and the reference potential create an electric field within the first doped region which amplifies the freed charge carriers by avalanche multiplication, and wherein the avalanche multiplication is self-limited by reducing the electric field.

41. The imaging system of claim 40, wherein the electric field is reduced by delaying the passage of the amplified freed charge carriers through the resistive layer.

42. The imaging system of claim 38, wherein the first conductivity type is p-type and the second conductivity type is n-type.

43. The imaging system of claim 38, wherein the conductive layer is coupled to the bias potential through a sensing element.

44. The imaging system of claim 38, wherein the intrinsic semiconductor layer is crystalline silicon.

45. The imaging system of claim 38, wherein the resistive layer is silicon carbide.

46. The imaging system of claim 38, wherein the resistive layer is $Si_xO_y$.

47. The imaging system of claim 38, wherein the intrinsic semiconductor layer is coupled to the reference potential through a sensing element.

* * * * *